(12) United States Patent
Kawano et al.

(10) Patent No.: US 6,891,368 B2
(45) Date of Patent: May 10, 2005

(54) MAGNETORESISTIVE SENSOR DEVICE

(75) Inventors: Yuji Kawano, Tokyo (JP); Naoki Yasuda, Tokyo (JP); Motohisa Taguchi, Tokyo (JP); Ikuya Kawakita, Tokyo (JP); Shinichi Hosomi, Tokyo (JP); Tatsuya Fukami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 47 days.

(21) Appl. No.: 10/287,524

(22) Filed: Nov. 5, 2002

(65) Prior Publication Data

US 2003/0197503 A1 Oct. 23, 2003

(30) Foreign Application Priority Data

Apr. 19, 2002  (JP) ........................................ 2002-117741

(51) Int. Cl.[7] .............................................. G01R 33/02
(52) U.S. Cl. ......................... 324/252; 428/692; 428/693
(58) Field of Search ....................... 324/207.21, 207.25, 324/252, 174; 340/551; 360/326; 428/692, 693

(56) References Cited

U.S. PATENT DOCUMENTS

| 6,072,311 | A  | * | 6/2000 | Shinjo et al. ................ 324/174 |
| 6,426,620 | B1 | * | 7/2002 | Taguchi et al. .......... 324/207.21 |
| 6,703,132 | B1 | * | 3/2004 | Yasuda et al. ............... 428/447 |

FOREIGN PATENT DOCUMENTS

| JP | 59-159565 A | 9/1984 |
| JP | 07-106328 A | 4/1995 |
| JP | 08-316033 A | 11/1996 |
| WO | WO 0146708 A1 | 6/2001 |

OTHER PUBLICATIONS

"GMR Revolution Sensors for Automobiles" T. IEE Japan, vol. 120–E, No. 5, 2000 pp219–224, Abstract.
D. Wang, J. Anderson, J.M. Daughton "Thermally Stable, Low Saturation Field, Low Hysteresis, High GMR CoFe/Cu Multilayers" IEEE Transactions on Magnetics, vol. 33, No. 5, 1997 pp 3520–3522.
Patent Abstracts of Japan, publication No. 08–316033, Nov. 29, 1996.
Patent Abstracts of Japan, publication No. 59–159565, Sep. 10, 1984.

* cited by examiner

*Primary Examiner*—Anjan Deb
*Assistant Examiner*—Reena Aurora
(74) *Attorney, Agent, or Firm*—Sughrue Mion, PLLC

(57) ABSTRACT

A magnetoresistive sensor device including a substrate, and a sensing portion and a signal processing circuit formed above the substrate with a resin film being disposed between the sensing portion and the signal processing circuit. The sensing portion detects changes in a magnetic field induced by a moving body, is located at a position for effectively detecting changes in a magnetic field induced by the moving body, and is constituted by a magnetoresistive sensor element.

10 Claims, 11 Drawing Sheets

MAGNETORESISTIVE SENSOR DEVICE

BACKGROUND OF THE INVENTION

1. Field of the Invention

The present invention relates to a magnetoresistive sensor device for detecting a change in a magnetic field induced by a moving body. For example, it relates to a magnetoresistive sensor device for detecting the number of revolutions and angle of rotation of rotating objects. Specifically, the present invention relates to a magnetoresistive sensor device for detecting a change in the magnetic field induced by the moving body having a monolithic structure in which a sensing portion can be formed at any desired position above a signal processing circuit (integrated circuit IC) and can be located at the optimum position of the sensing portion for effectively detecting change in the magnetic field.

2. Description of the Related Art

In a magnetoresistive sensor device for detecting a change in a magnetic field induced by a moving body (a rotating object) such as a rotary sensor, the sensing portion is located at a position where a change in a magnetic field in the magnetic circuit comprising the moving body can be most effectively detected. The optimum position of the sensing portion in the magnetoresistive sensor device is related to 3-dimensional positional relation ships such as the structure of the moving body and magnetoresistive sensor device (the existence of a magnet, the positional relation of the magnet and the sensing portion, etc.) or the magneto-sensitive direction of the sensor element, as well as the desired form of output signal. A brief example is shown herein. FIG. 12 is a diagram for describing an example of the structure of a conventional rotary sensor. FIG. 13 is a structural diagram of a Wheatstone bridge circuit using in a rotary sensor. In FIG. 12, a magnetoresistive sensor device 23 is disposed opposite a rotating object 21 made from a magnetic body. The device 23 comprises a sensing portion 11 and a magnet 24. The sensing portion 11 is disposed in sensor element regions 12a and 12b. In FIG. 13, the Wheatstone bridge circuit comprises sensor elements 13, 14, 15 and 16. The sensor elements 13 and 16 are disposed in the sensor element region 12a, while the sensor elements 14 and 15 are disposed in the sensor element region 12b. A terminal 17 connecting to the sensor elements 13 and 15 is a power source terminal. A terminal 18 grounding the sensor elements 14 and 16 is a GND terminal. A terminal 19 connecting to the sensor elements 13 and 14 and a terminal 20 connecting to the sensor elements 15 and 16 are terminals indicating the medial point potentials between the terminals 17 and 18 respectively, and they are respectively connected to a differential amplification circuit. In FIG. 12, the rotating object 21 has an irregular form. It is composed of tooth parts (teeth) 22a and non-tooth parts (slots) 22b. The device 23 can detect a change in a magnetic field induced by the rotation of the teeth 22a and slots 22b on the rotating object 21. The difference between the magnetic field generated in the sensor element regions 12a and 12b is an output as a potential difference between medial point potential terminals 19 and 20 in the Wheatstone bridge circuit. FIG. 14 is a diagram for describing the relationship between the position of the sensing portions and the rotating object and the generated magnetic field. The optimum position of the sensing portion is shown, for example, in FIG. 14A. When the sensor element region 12a is disposed at a position corresponding to the tooth 22a of a rotating object 21, while the sensor element region 12b is disposed at a position corresponding to the slot 22b of a rotating object 21, difference in magnetic fields between the sensor element regions 12a and 12b is largest. In comparison, in the case of FIGS. 14B and 14C, the difference in magnetic fields between the sensor element regions 12a and 12b is smaller. In other words, in the example the optimum distance between the sensor element regions 12a and 12b is determined by the distance between two teeth 22a on the rotating object.

When there is a wide variety of moving body specifications (input signal specifications), in order to locate the optimum position of the sensing portion, so-called hybrid structures are often used in which, for example, the sensing portion and IC are separately fabricated to thereby provide positional flexibility to the positioning of the sensing portion. In a hybrid structure, as the sensing portion and the IC are separately fabricated, it is not necessary to consider matching in the fabrication process of the film-like magnetoresistive sensor elements often used for the magnetoresistive sensor device and the IC.

On the other hand, in recent years, higher precision sensing has been sought in magnetoresistive sensor devices as well and along with a higher sensitivity in the magnetoresistive sensor element for the purpose of improving a signal-to-noise ratio (S/N ratio), integration of the sensing portion and IC, so-called monolithic structures have been receiving attention as measures for noise reduction. Monolithic structures also have the advantages in reliability.

As noted heretofore, although hybrid structures have conventionally been used often in the structure of the magnetoresistive sensor devices, examination and practical use of monolithic structures have begun in response to recent demands for higher precision sensing. Indeed, the monolithic structures of the highly sensitive magnetoresistive sensor device have been reported on by, for example, Fukami et al (Integrated GMR Sensors for Automobiles, T IEE Japan, Vol. 120-E, No. 5, 2000). In the report, a high sensitivity giant magnetoresistive (GMR) sensor element is used as a magnetoresistive (MR) sensor element for the purpose of achieving higher precision. Furthermore, they proposed a monolithic structure having a GMR sensor element and IC in combination for solving the problems of SIN ratio in the hybrid structure. In making the move to a monolithic structure, matching of the magnetic film fabrication process and the IC fabrication process was studied. As a result, they have obtained excellent matching properties even for GMR sensor elements sensitive to the underlying conditions. The monolithic structures with the IC and the sensing portions have been achieved with exclusive regions for the sensing portions disposed within the IC. However, this structure fixes the position of the sensing portion. As a result, the specifications for detectable moving bodies are limited, thus making it difficult to respond to diverse input signal specifications.

There is also great demand for higher precision in magnetoresistive sensor devices, further accompanied with a need to respond to diversification of the detecting magnetic field (input signal specifications). For these two requirements, in the structure of magnetoresistive sensor devices, monolithic structures will be selected for increased sensitivity and hybrid structures will be selected for positional flexibility of the sensing portion. However, compatibility is difficult to achieve as these two structures are mutually incompatible. Highly sensitive elements are required for higher precision sensing. For example, these include magnetoresistive (MR) sensor elements such as giant magnetoresistive (GMR) sensor elements. Since this element exhibits sensitivity to the substrate, it is necessary to provide an exclusive region for the sensing portion within the IC as mentioned above. This fixes the position of the sensing portion and thus there is no flexibility in locating the sensing portion for a variety of input signal specifications.

A typical example of this problem occurs in vehicle-mounted revolution sensors. Vehicle-mounted revolution sensors have a rotating object facing a magnetoresistive sensor element and detect any changes in a magnetic field induced by the rotating object. Although the sensing signal is used for engine control, transmission control and the like, higher precision is being required in recent years, for example, because of more stringent exhaust gas regulations. Vehicle-mounted sensors also require to guarantees of operation under severe environments and sensor elements have realized high precision and high reliability by making then monolithic. On the other hand, with regard to rotating bodies, there exist a wide variety of specifications corresponding to each automobile manufacturer, each model or each control purpose. With conventional monolithic structures, a new IC had to be made even if same signal processing is possible, because they do not have flexible positioning of the sensing portion for different input signal specifications. The separate fabrication of ICs became a great stumbling block in manufacturing products having high efficiencies and quality, and cost reductions.

FIG. 15 is a sectional view showing an example of a conventional monolithic magnetoresistive sensor device. IC 5 is constituted by forming a circuit 1, an interlayer insulating layer 2, a first wiring 3 and an IC protective film 4 in that order on a substrate 100. A sensing portion 11 is formed on the interlayer insulating layer 2, within the exclusive region disposed above the IC 5. In the FIG., 8 is a MR sensor element film and 9 is a protective film for the magnetoresistive sensor device.

The magnetoresistive sensor device having such monolithic structure is produced by step of first removing the protective film 4 on the exclusive region for the sensing portion 11 above the IC 5 and forming the sensing portion 11 on the interlayer insulating layer 2. The electric connection between the sensing portion 11 and the IC 5 is produced by removing the protective film 4 and then by forming the sensing portion 11 on the first wiring 3 formed on a part area within an exclusive region.

SUMMARY OF THE INVENTION

Accordingly, an object of the present invention is to provide a magnetoresistive sensor device of a monolithic structure in which the sensing portion can be formed at any desired position above the IC and can be located in a position optimum for the sensing portion to effectively detect changes in the magnetic field. Specifically, the present invention is aimed at providing a highly sensitive magnetoresistive sensor device of a monolithic structure in which an MR sensor element, especially a GMR sensor element which can show favorable characteristics at any position on the IC.

Specifically, the present invention provides, in one aspect, a magnetoresistive sensor device comprising a substrate, and a sensing portion and a signal processing circuit formed above said substrate with a resin film being disposed between said sensing portion and said signal processing circuit:

wherein said sensing portion detects changes in a magnetic field induced by a moving body and further said sensing portion is located at a position for effectively detecting changes in a magnetic field induced by said moving body, said sensing portion comprising a magnetoresistive sensor element.

The sensing portion is preferably constituted by a giant magnetoresistive sensor element.

In the magnetoresistive sensor device in the present invention, 1) said giant magnetoresistive sensor element comprises magnetic layers mainly containing Ni, Fe and Co alternately laminated with nonmagnetic layers mainly containing Cu, wherein said magnetic layers satisfy an atomic compositional ratio represented by the following formula:

$$Ni_{(1-x-y)}Fe_yCo_x,$$

where $x \geq 0.7$, $y \leq 0.3$, and $(1-x-y) \leq 0.15$, and said nonmagnetic layers satisfy an atomic compositional ratio represented by the following formula:

$$Cu_zA_{(1-z)},$$

where A is any additive element other than Cu, and $z \geq 0.9$, wherein the thickness of said magnetic layers(tm) and said nonmagnetic layers(tn) satisfies the following conditions respectively:

$$10\ \text{Å} < tm < 25\ \text{Å and } 18\ \text{Å} < tn < 25\ \text{Å},$$

2) said giant magnetoresistive sensor element has a periodically repeating structure comprising a laminated body of said magnetic layers laminated with said nonmagnetic layers as one unit thereof, wherein the repeating number(N) of said periodically repeating structure satisfies the following conditions:

$$10\ \text{Å} \leq N \leq 40,$$

3) said giant magnetoresistive sensor element comprises a buffer layer disposed between said resin film and said magnetic layers or disposed between said resin film and said nonmagnetic layers, wherein the thickness of said buffer layer(tb) satisfies the following conditions:

$$10\ \text{Å} < tb < 80\ \text{Å},$$

The magnetoresistive sensor device is preferably mounted on a vehicle.

The resin film is preferably a cured film of silicone polymer having an average molecular weight of equal to or greater than 1000 and composed only of 1 to 4 units of the following Structural Units Group (1):

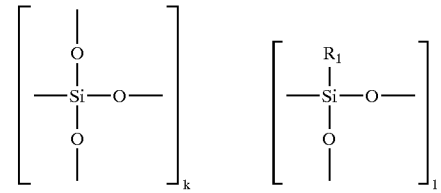

-continued

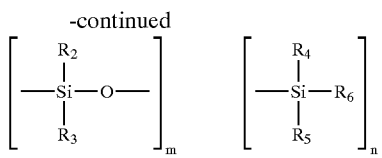

wherein $R_1$, $R_2$, $R_3$, $R_4$, $R_5$ and $R_6$ are a hydrogen atom, a hydroxyl, an aryl an aliphatic alkyl, and a trialkylsilyl group, or a functional group having an unsaturated bond, and k, l, m and n are an integer greater than or equal to 0, but all of them are not all 0.

The resin film is preferably a cured film of silicone polymer represented by the following Formula (2):

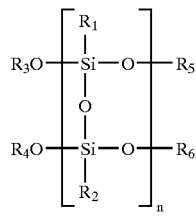

wherein $R_{1'}$ and $R_{2'}$ are a hydrogen atom, an aryl, an aliphatic alkyl group, or a functional group having an unsaturated bond, and $R_{3'}$, $R_{4'}$, $R_{5'}$ and $R_{6'}$ are a hydrogen atom, an aryl, an aliphatic alkyl, a trialkylsilyl group, or a functional group having an unsaturated bond and n is a natural number.

Preferably, the resin film has an average molecular weight of equal to or greater than 100,000.

Preferably, the resin film has an average molecular weight of equal to or less than 50,000.

Alternatively, the resin film may satisfy an organic component ratio of equal to or greater than 0.4.

Preferably, the resin film may be composed of a laminated film comprising a plurality of film layers, each of said film layers being composed of a cured film of a different curing polymer.

In the magnetoresistive sensor device, the laminated film may comprise at least one cured film of a silicone polymer represented by said Formula (2) having an average molecular weight of equal to or greater than 1,000 up to 50,000 and an organic component ratio of equal to or greater than 0.4.

In the magnetoresistive sensor device, the laminated film may comprise at least one cured film of a silicone polymer represented by said the Formula (2) having an average molecular weight of equal to or greater than 1,000 up to 50,000 and an organic component ratio of equal to or less than 0.4.

DETAILED DESCRIPTION OF THE INVENTION

Figure 1:
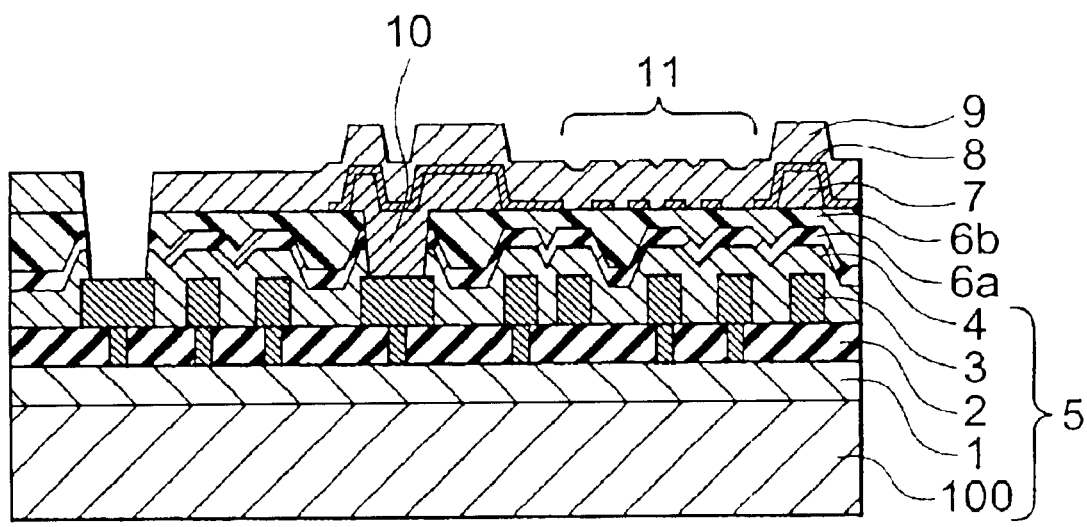
FIG. 1 is a sectional view of a magnetoresistive sensor device showing an embodiment of the present invention.

Specifically, the magnetoresistive sensor device according to the present invention can detect changes in the magnetic field induced by the moving body by using the MR sensor element at the sensing portion and the MR sensor element is formed above the IC through a resin film.

Further, optimal positioning of the magnetoresistive sensor device to effectively detect changes in the magnetic field induced by the moving body can be flexibly carried out within the range of the IC area and it is possible to have correspond to different moving bodies the same IC as long as the same signal processing is possible. More specifically, the high sensitivity and high reliability of monolithic structures can be exhibited along with the flexibility in positioning the sensing portion of the hybrid structures. As a result, a product having high quality and high capabilities can be produced cheaply.

Further, the sensing portion is formed above the IC through the resin film and it is not necessary provide an exclusive region for the sensing portion formed within the IC in conventional monolithic structures. Therefore, the area of IC can be made small despite the monolithic structures. Additionally, as parts other than IC constituting the sensor, such as surge protection resistance current also can be formed on the IC, for example, the number of sensors part can be reduced without increasing the IC area.

When the GMR sensor element is used as the MR sensor element, further improvement of sensitivity can be achieved. When the cured film of silicone polymer composed of 1 to 4 units of the structural units group (1) and having an average molecular weight of equal to or greater than 1,000 is used as the resin film, the cured film can sufficiently ameliorate any level differences which may affect the structure of GMR sensor elements composed of a very thin layer. Therefore, the GMR sensor element formed on an IC exhibit characteristics more than equal to those where it is formed on oxidation film substrates such as a conventional flat Si substrate or PSG (Phosphorous Silicate Glass).

Further, it also can maintain excellent characteristics under the severe environment of a so-called heat shock endurance test (temperature range −40° C. to 140° C.) and enough quality can be secured for application in vehicle-mounted sensors, for instance.

Furthermore, when the cured film of the silicone polymer represented by Formula (2) and having an average molecular weight of equal to or greater than 1,000 is used as the resin film, the GMR sensor element on IC exhibit satisfactory characteristics, excellent characteristics can also be maintained under severe environments and matching with the GMR sensor element above the IC is good. Further, the silicone polymer is preferably one in which the aryl group is equal to or less than 15 carbon, atoms, the aliphatic alkyl group is equal to or less than 10 carbon atoms, and the trialkylsilyl group is equal to or less than 15 carbon atoms.

Also, when the cured film of silicone polymer represented by the Formula (2) and having an average molecular weight of from 1,000 to 50,000 is used as the resin film, the resin film has melt flow (reflow) properties before curing and has a higher function for filling in the level differences. If the resin film has a film thickness of more than the depth of the level difference for the various level differences on the IC, the surface of the resin film after it cures can have a fine smoothness, reducing variations in the characteristics of the GMR sensor element on the IC.

FIG. 1 is a sectional view of a magnetoresistive sensor device showing a preferred embodiment of the present invention. IC 5 is constituted by forming a circuit 1, an interlayer insulating layer 2, a first wiring 3, and an IC protective film 4 on a substrate 100 in this order. A sensing portion 11 is formed above the IC 5, and a resin film 6a and a resin film 6b are disposed between said sensing portion 11 and the IC 5. Reference number 8 indicates an MR sensor element film and 9 indicates a protective film of the magnetoresistive sensor device.

Figure 2:
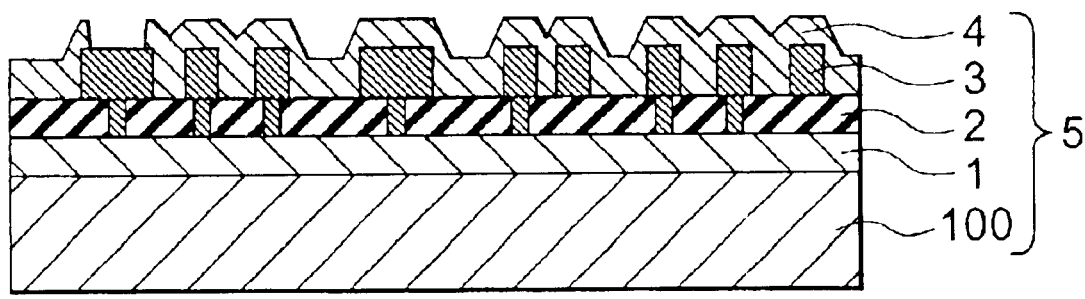
FIG. 2 is a sectional view of an example of an IC that can be used in the present invention.

FIG. 2 is a sectional view of an example of IC 5 which can be used in the present invention. It is in a state before the sensing portion 11 is formed.

The electric connection between sensing portion 11 and IC 5 is achieved through contact hole 10 which penetrates through resin film 6a, 6b, and IC protective film 4. In the manufacturing process, for example, after the resin films 6a and 6b are formed, the contact hole 10 is formed before the sensing portion 11 is formed, then the second wiring 7 is formed on the resin film 6b, and the sensing portion 11 is formed. The MR sensor element film 8 is used as the sensing portion 11 and it is patterned after the film is formed.

The IC protective film 4 generally uses inorganic films such as glass coat and SiNx films. The protection film 9 in the upper layer may use material similar to that of the IC protective film 4. Although the wiring (the first wiring) 3 within IC may use AlSi, AlSiCu and AlCu etc. mainly containing Al, as well as Cu, the second wiring 7 on the resin film 6b in the upper layer may use material similar to that of the first wiring 3. The structure of the resin film may consist of one layer or a plurality of layers. Examples of individual structures are described below.

EXAMPLES

The present invention will be illustrated in further detail with reference to several inventive examples and comparative examples below.

Example 1

Figure 3:
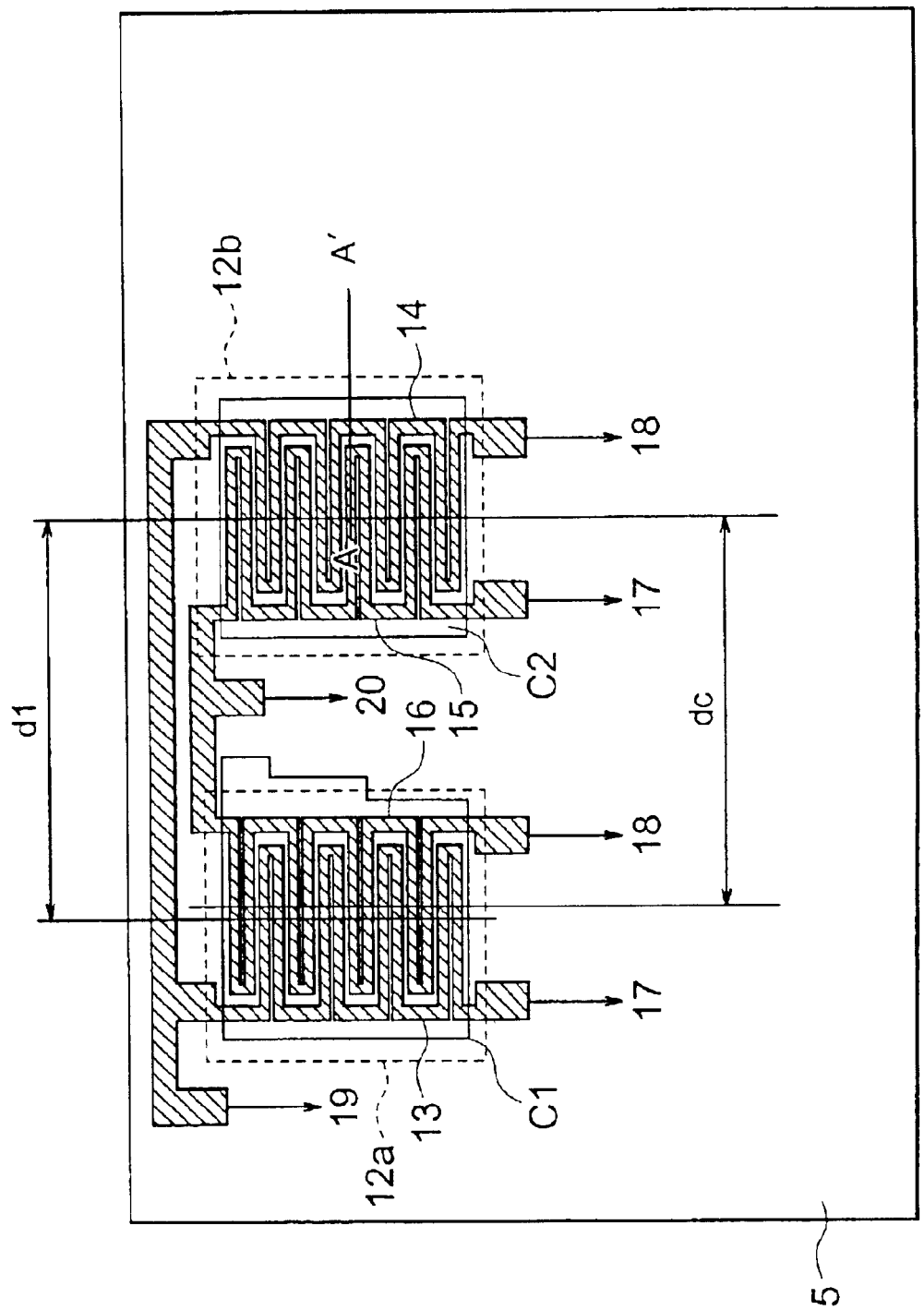
FIG. 3 is a plane view of the magnetoresistive sensor device in Example 1.
Figure 4:
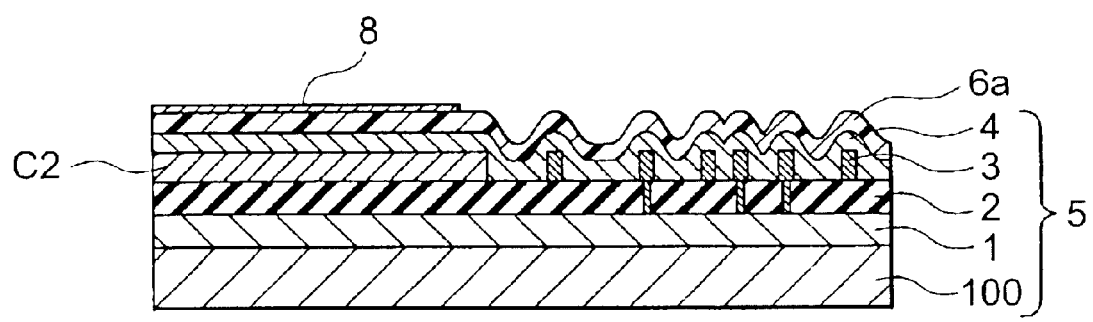
FIG. 4 is a sectional view of the magnetoresistive sensor device in Example 1 taken along line A–A' of FIG. 3.

FIG. 3 is a plane view of a magnetoresistive sensor device according to the present Example. The IC 5 used in the present Example has two relatively large capacitors C1 and C2 and the interval between C1 and C2 was set to dc. The sensor elements 13, 14, 15 and 16 formed above the IC were anisotropic magnetoresistance (AMR) sensor elements. The sensor elements were arranged in the sensor element regions 12a and 12b, and the interval between 12a and 12b was set to d1. Because the intervals were dc≈d1 here, the sensor element regions 12a and 12b were formed above the two capacitors C1 and C2 respectively. The patterns of the sensor elements in FIG. 3 are well-known conventional element patterns and these sensor elements constituted a Wheatstone bridge circuit. FIG. 4 is a sectional view taken along line A–A' of FIG. 3 of a magnetoresistive sensor device according to the present Example. The protective film 9 is omitted in FIG. 4. As the capacitor had a relatively flat surface and the sensor element region 12b was formed on the capacitor C2 in the IC, the MR sensor element film 8 as sensor element 15 did not have unevenness. The sensor element region 12a was also formed on the capacitor, so it was similar in sectional form to the sensor element region 12b. In the present Example, the resin film 6a was disposed between the sensing portion and the IC. The resin film 6a used a film in which silicone polymer (A) was subjected to a heat curing process after application. This silicone polymer (A) is composed of 4 units of the structural units group (1) having an average molecular weight of 150,000, wherein among R1, R2, R3, R4, R5 and R6 in the side chains, 40% are phenyl groups, 30% are vinyl groups and 30% are methyl groups, and the mole ratios of k:l:m:n were 5:10:4:1.

The magnetoresistive sensor device according to the present Example was produced as follows. Firstly the resin film 6a having a thickness of 1.2 micrometers was formed on IC 5. That is, the silicone polymer (A) was applied on IC 5 by spin coating and then subjected to post baking in an oven in $N_2$ atmosphere to thereby heat cure the resin film 6a. The post baking was performed, for example, at 350° C. for 1 hour. Thereafter, the film was subjected to photolithography and a contact hole was formed by dry etching. Although the method of dry etching may be, for example, reactive ion etching or the ion beam etching, it is desirable to use a method with a smaller selection ratio for etching a IC protective film 4 and the resin film 6a in order to form a good sectional shape of the side wall in the contact hole. Next, although not illustrated, an AlSi film was formed by sputtering on the resin film 6a. The film was subjected to photolithography by wet etching to thereby form the second wiring 7. Thereby the second wiring 7 was connected with the first wiring 3 through the contact hole. For this connection, it is preferable to process by ion beam etching to remove the surface oxide of the first wiring 3 within the contact hole before forming the AlSi film. This treatment may be carried out by inversion sputtering, if the film of the second wiring 7 is formed by sputtering. In forming the second wiring 7, the sectional form of the wiring pattern edge is preferably formed in a taper shape for bonding of the second wiring 7 and MR sensor element film 8, so it is preferably formed by wet etching. Next, the NiCo film manifested by the AMR effect was formed on the resin film 6a and the second wiring 7 by sputtering. The film was subjected to photolithographic etching by dry etching to thereby form sensing portion 11. Etching may include, for example, both wet and dry etching methods such as reactive ion etching and ion beam etching, and it is preferable to use methods that do no damage to MR sensor element film 8. Further, the $Si_3N_4$ film was formed by sputtering to form the protective film 9. The film was subjected to heat treatment as necessary for stabilization of the characteristic of MR sensor element film 8. Then, the film was subjected to photolithography and a hole on the top of the IC pad was opened by dry etching.

In addition, the film of the present Example can be formed by a sputtering process. The film may be formed by vapor deposition, molecular beam epitaxy (MBE) and chemical vapor deposition (CVD), etc., which may be selected based on the material of the film, and the characteristics and productivity of the resulting sensor element.

As the underlying face of the sensing portion in the present Example had a relatively flat surface on the capacitor in the IC, the resin film 6a thus also had a satisfactory flatness. The AMR sensor elements had excellent characteristics, suffered no disconnection of the element patterns and no degradation of the characteristics after endurance tests.

Example 2

Figure 5:
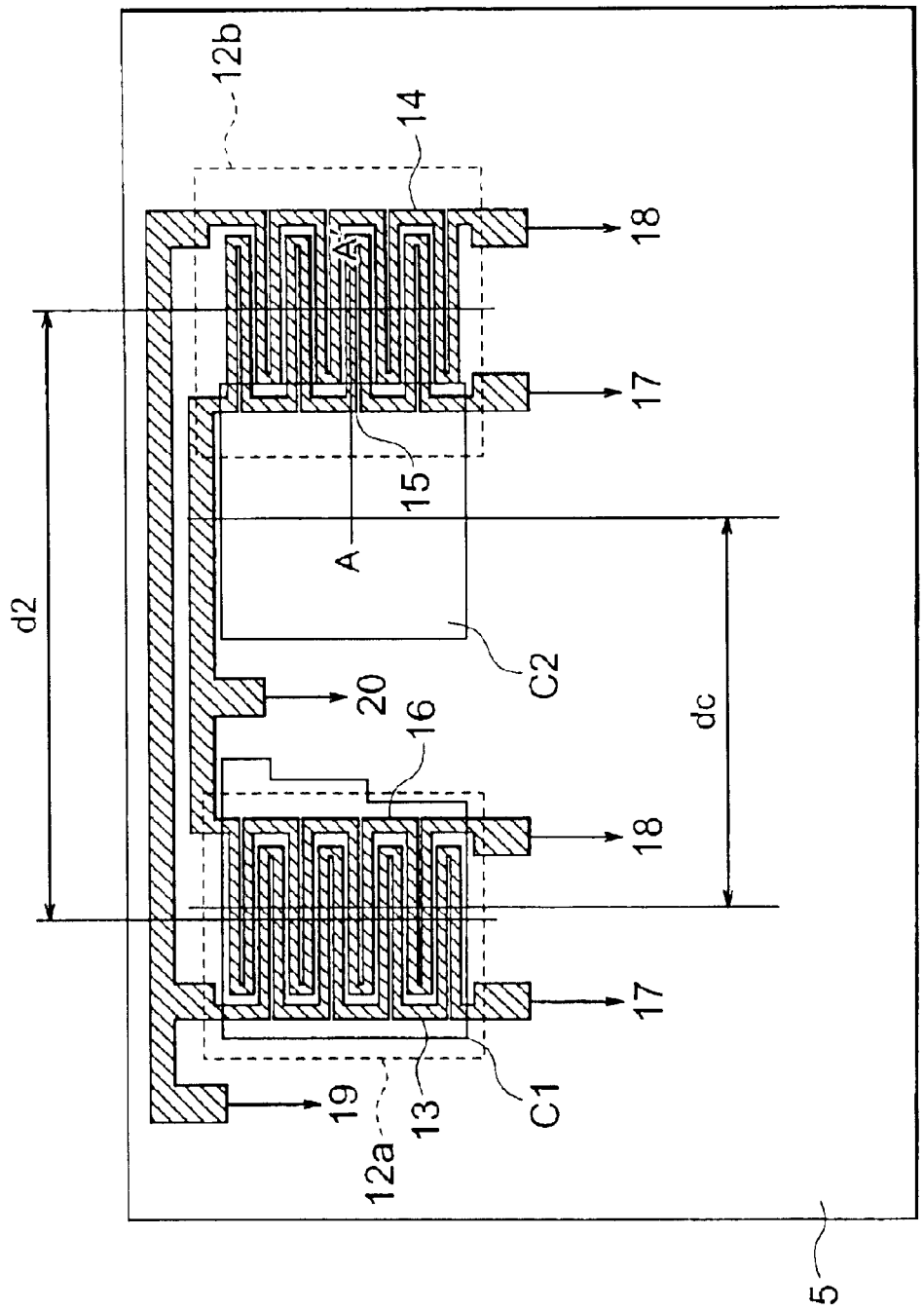
FIG. 5 is a plane view of a magnetoresistive sensor device in Example 2.
Figure 6:
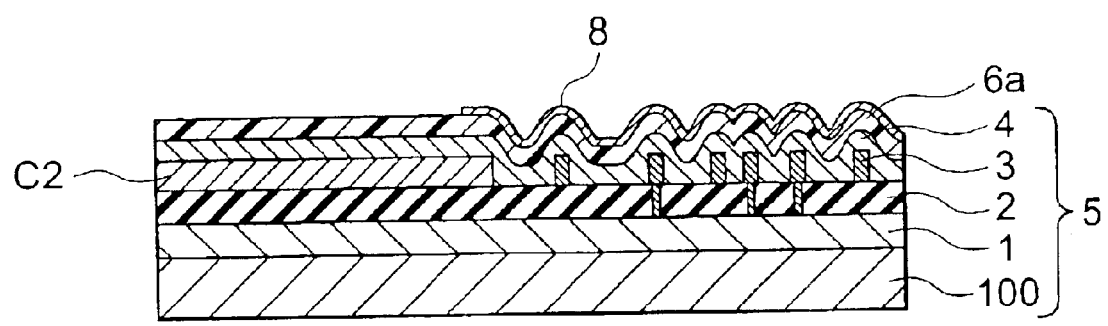
FIG. 6 is a sectional view of a magnetoresistive sensor device in Example 2 taken along line A–A' of FIG. 5.

FIG. 5 is a plane view of a magnetoresistive sensor device according to the present Example. The IC used in the present Example was similar to that used in Example 1 and had two relatively large capacitors C1 and C2. The interval between C1 and C2 was set to dc. The sensor elements formed above the IC were AMR sensor elements. The sensor elements were arranged in the sensor element regions 12a and 12b and the interval between 12a and 12b was set to d2. Because the intervals were dc.d2 here, only the sensor element region 12a was formed above the capacitor. The patterns of the sensor elements in FIG. 5 were similar to conventional element patterns and constituted a Wheatstone bridge circuit. FIG. 6 is a sectional view taken along line A–A' of FIG. 5 of a magnetoresistive sensor device according to the present Example. The protective film 9 is omitted in FIG. 6. The sensor element region 12a was formed above the capacitor C1 in the IC and had a relatively flat surface on the capacitor. In contrast, the sensor element region 12b was formed above the IC where the wiring is intricate and therefore the level differences of the wiring made an uneven surface. The resin film 6a was disposed between the sensing portion and the IC 5. The resin film 6 was similar to silicone polymer (A) as used in Example 1 and was subjected to a heat curing process after application.

The magnetoresistive sensor device according to the present Example was produced by a process similar to that in Example 1. The resin film 6a having a thickness of 1.2 micrometers was formed. At the time of completing the process, the film thickness had been reduced by milling the surface by ion beam etching, thereby resulting in the resin film having a thickness of about 1 micrometer.

In the underlying face of the sensing portion in the present Example, the sensor element region 12a was formed above the capacitor C1 in the IC and had satisfactory flatness on the resin film 6a. In contrast, the sensor element region 12b was formed above the IC where the wiring is intricate and therefore the level differences of the wiring resulted in the resin film 6a having an uneven surface reflecting the level differences. As the silicone polymer (A) of resin film 6a was a polymer having an average molecular weight of greater than 100,000, it thereby had a lower function for filling in the level differences, but as it smoothes out the rectangular portions of the level differences on the IC, the level differences were reduced. Therefore, the patterns of the AMR sensor elements had no disconnection of patterns, so there were no differences in resistance between the sensor element regions 12a and 12b when applying a magnetic field greater than the saturation magnetic field of the AMR sensor elements or when there was no magnetic field, providing good balance between the potentials of the medial point potential terminals 19 and 20 in the Wheatstone bridge circuit. The AMR sensor elements also had satisfactory characteristics and although there was less variations in the characteristics compared to Example 1, thus would not be a problem in practical use. Further, the AMR sensor elements had no degradation after the endurance tests.

Example 3

The sensor elements formed above the IC in the present Example were GMR sensor elements and were arranged in the sensor element regions 12a and 12b. The arrangement of the sensing portion of the sensor elements was similar to that in Example 2. The interval between the capacitors C1 and C2 in the IC was dc, while the interval between the sensor element regions 12a and 12b was d2. A plane view of the sensor elements of the present Example corresponds to FIG. 5. The patterns of the sensor elements in FIG. 5 are similar to well-known conventional element patterns and constituted a Wheatstone bridge circuit. The sensor element region 12a was formed above the capacitor C1 in the IC and had a relatively flat surface on the capacitor. In contrast, the sensor element region 12b was formed above the IC where the wiring was intricate and therefore the level differences of the wiring made an uneven surface. The resin film 6a was disposed between the sensing portion and the IC. The resin film 6a used a film in which silicone polymer (B) was subjected to a heat curing process after application. This silicone polymer (B) had structure represented by the Formula (2) having an average molecular weight of 200,000, wherein among R1 and R2 in the side chain, 80% are phenyl groups and 20% are allyl groups and among R3, R4, R5 and R6, all are hydrogen atoms. Since this resin film 6a was also a polymer having an average molecular weight of greater than 100,000, it had a lower function for filling in the level difference. Therefore an A–A' sectional view of sensor elements in the present Example was similar to the structure shown in FIG. 6.

The magnetoresistive sensor device according to the present Example was produced by a process similar to that in Examples 1 and 2. The resin film 6a having a thickness of 1.2 micrometers was formed by using the silicone polymer (B) in the present Example. At the time of the completing process, the film thickness had been reduced similar to Example 2, thereby resulting in the resin film having a thickness of about 1 micrometer. Further, the GMR sensor element film was formed by sputtering in the present Example. The film structure was composed of a magnetic layer and a nonmagnetic layer formed on a buffer layer (thickness of 50 angstroms), and the magnetic layer and the nonmagnetic layer were laminated on each other. For example, the magnetic layer was composed of $Fe_yCo_x$, wherein $x \geq 0.7$ and $y \leq 0.3$, the nonmagnetic layer was composed of Cu, and the buffer layer had the same compositional ratio as in the magnetic layer. The thickness of the magnetic layer (tm) and the nonmagnetic layer (tn) each satisfied $10 \text{ Å} < tm < 25 \text{ Å}$ and $18 \text{ Å} < tn < 25 \text{ Å}$. A laminated structure composed of the magnetic layer and the nonmagnetic layer was defined as a repeating constitutional unit, the repeating number N of the repeating constitutional unit was 20. The following seven structural samples were prepared according to the processes in the present Example.

Structural Sample 1 had conditions of x=0.9, tm=15 angstroms, and tn=21 angstroms.

Structural Sample 2 had conditions of x=0.9, tm=20 angstroms, and tn=20 angstroms.

Structural Sample 3 had conditions of x=0.9, tm=12 angstroms, and tn=22 angstroms.

Structural Sample 4 had conditions of x=0.8, tm=18 angstroms, and tn=20 angstroms.

Structural Sample 5 had conditions of x=0.75, tm=22 angstroms, and tn=19 angstroms.

Structural Sample 6 had conditions of x=1.0, tm=15 angstroms, and tn=20 angstroms.

Structural Sample 7 had conditions of x=1.0, tm=11 angstroms, and tn=23 angstroms.

The GMR sensor element film can be formed, for example, by vapor deposition, molecular beam epitaxy (MBE) or sputtering, of which sputtering is preferred from the viewpoint of the characteristics and productivity of the resulting sensor elements. Further the sensing portion was formed and then a protective film 9 such as a $Si_3N_4$ film was formed and subjected to heat treatment at 250° C. for 12 hours.

The underlying face of the sensing portion in the present Example was similar to that in Example 2. The sensor element region 12a was formed above the capacitor C1 in the IC and had satisfactory flatness on the resin film 6a. In contrast, the sensor element region 12b was formed above the IC where the wiring was intricate and therefore the level differences of the wiring resulted in the resin film 6a having an uneven surface reflecting the level differences. As the silicone polymer (B) of resin film 6a was a polymer having an average molecular weight of greater than 100,000, it thereby had a lower function for filling in the level difference, but as it smooth out similar to resin film of the silicone polymer (A) the rectangular portions of the level differences on the IC, the level differences were reduced. Therefore, the GMR sensor elements had no disconnection of pattern, so there were no differences in resistance between the sensor element regions 12a and 12b when applying a magnetic field greater than the saturation magnetic field of the GMR sensor elements or when there was no magnetic field, providing a good balance between the potentials of the medial point potential terminals 19 and 20 in the Wheatstone bridge circuit. In addition, the GMR sensor elements had relatively good characteristics and although there was less variations in the characteristics, there was no significant lowering of the characteristics. Further, the GMR sensor elements had no degradation after the endurance tests. The GMR sensor elements according to the present Example had high heat resistant structural properties. These properties were not as degraded on the resin film 6a of this Example as the oxidation film underlying conventional flat Si substrates or PSG (Phosphorous Silicate Glass).

Example 4

Figure 7:
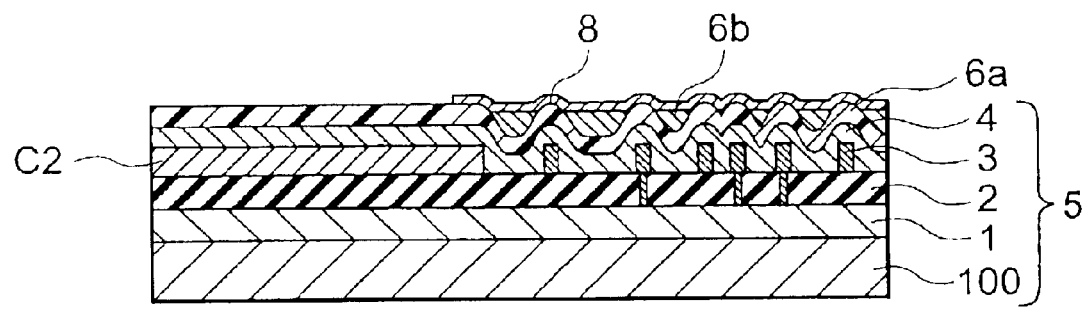
FIG. 7 is a sectional view of a magnetoresistive sensor device in Example 4 taken along line A–A' of FIG. 5.

The structure of the magnetoresistive sensor device according to the present Example was similar to that in Example 3 except for the resin film. The sensor elements were GMR sensor elements and were arranged in the sensor element regions 12a and 12b. A plane view of a magnetoresistive sensor device according to the present Example corresponds to FIG. 5. The sensor element region 12a was formed above the capacitor C1 in the IC and had a relatively flat surface on the capacitor. In contrast, the sensor element region 12b was formed above the IC where the wiring was intricate and therefore the level differences of the wiring made an uneven surface. The resin film was disposed between the sensing portion and the IC and differs from any of the previous Examples. The resin film of the present Example had a two-layer structure consisting of resin films 6a and 6b. The resin film 6a was similar to silicone polymer (B) as used in Example 3 which was subjected to a heat curing process after application. Further, the resin film 6b was formed on the resin film 6a and it used a film in which silicone polymer (C) was subjected to a heat curing process after application. This silicone polymer (C) had the structure represented by Formula (2) having an average molecular weight of 5,000, wherein every R1 and R2 in the side chain, is an ethyl group, and among R3, R4, R5 and R6, 50% are methyl groups and 50% are hydrogen atoms. Since the resin film 6a was a polymer having an average molecular weight of greater than 100,000, it had a lower function for filling in the level differences. In contrast, the resin film 6b was a polymer having an average molecular weight of less than 50,000 and had a melted flow (reflow) property before curing. Thereby the resin film 6b had a higher function for filling in the level differences. FIG. 7 is a sectional view taken along line A–A' of FIG. 5 of a magnetoresistive sensor device according to the present Example. The protective film 9 is omitted in FIG. 7.

The magnetoresistive sensor device according to the present Example was produced by a process similar to that in Example 3, with the exception that the process for resin film 6b production was somewhat altered in compliance with the structural change of the resin film portion. Thus, the formation of a contact hole and the opening of a pad were performed for the longer period of time required for etching the resin film 6b. The resin film 6a was formed in a thickness of 1.0 micrometers by using silicone polymer (B). The resin film 6b was formed on the resin film 6a at a thickness of 0.6 micrometers by using silicone polymer (C). The resin film 6b was subjected to heat treatment at a temperature equal to or higher than 110° C., the melting point of silicone polymer (C) prior to post-baking. Thereafter post-baking was performed, for example, at 350° C. for 1 hour. The thickness of the resin film 6b was reduced by process completion, thereby resulting in the resin film 6b having a thickness of about 0.3 micrometers. The GMR sensor element film formed in the present Example was the same as that formed by sputtering similar to Example 3.

The underlying face of the sensing portion in the present Example differs from that in Example 3 in that it is made with a resin film having a two-layer structure. The sensor element region 12a was formed above the capacitor C1 in the IC and therefore had satisfactory flat characteristics on the surface of the resin films 6a and 6b. In contrast, the sensor element region 12b was formed above the IC where the wiring was intricate and the level differences of the wiring made an uneven surface on the resin film 6a, while the resin film 6b filled in the unevenness on the resin film 6a to make the surface of the resin film 6b partially flat. As the silicone polymer (B) of the resin film 6a was a polymer having an average molecular weight of greater than 100,000, it thereby had a lower function for filling in the level differences. In contrast, the silicone polymer (C) of the resin film 6b was a polymer having an average molecular weight of less than 50,000, it thereby had a higher function for filling in the level differences. As the silicone polymer (C), however, had an organic component ratio of less than 0.4, it is liable to form cracks if it is made too thick, which dose not allow the resin film 6b to have adequate thickness sufficient to fill in the deepest level differences in the IC. Such inconvenience in the resin film 6b can be overcome by successfully filling in most of the parts of level differences in the IC aided by the alleviation effect of the resin film 6a of the level difference. In addition, a satisfactory underlying face was obtained combining the effect of making the rectangular portions of the level difference into a smooth shape brought by the resin film 6a. For the reasons set forth above, the GMR sensor elements had no disconnection of pattern so there were had no substantial difference of the resistance between the sensor element regions 12a and 12b when applying a magnetic field greater than the saturation magnetic field of the GMR sensor elements or when there was no magnetic field, providing a good balance the potentials of the medial point potential terminals 19 and 20 in the Wheatstone bridge circuit. In addition to the above, the characteristics of the underlying face were better with less variations in the characteristics and thus, improvement of the underlying face was observed in reference to that in Example 3. Further, no degradation was observed after the endurance tests, and the structure of a plurality of layers of resin films had higher reliability. Incidentally, the organic component ratio referred to in the present invention means the proportion of carbon weight to the total weight of the resin films.

Further, another form conceivable from the two layer structure of the resin films of the present Example can realize sensor characteristics similar to that of the present Example. The other form, in other words, a film structure wherein the cured film of silicone polymer (C) is applied to the resin film 6a and the cured film of silicone polymer (B) is applied to the resin film 6b in the two layer structure of the resin films of the present Example provides that the unevenness in the level difference on the IC is firstly filled in by resin film 6a and then the rectangular portions of the unfilled level difference are made into a smooth shape with the resin film 6b. This other form provides a good underlying face similar to the present Example, with similar good results in both sensor characteristics and variations thereof.

Example 5

Figure 8:
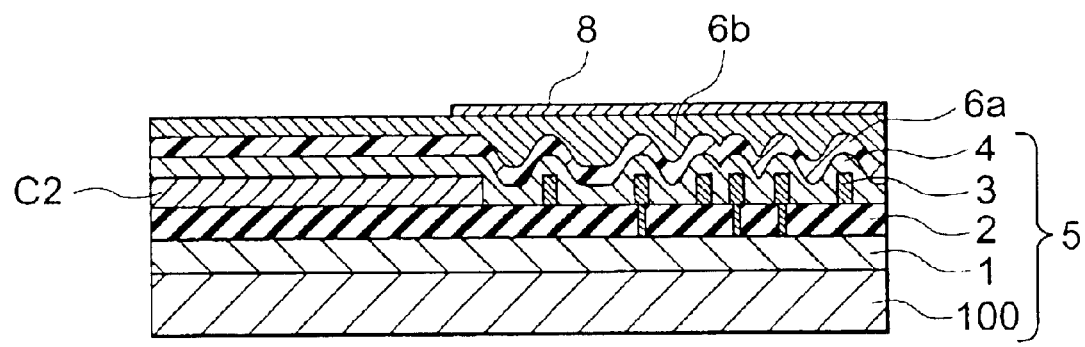
FIG. 8 is a sectional view of a magnetoresistive sensor device in Example 5 taken along line A–A' of FIG. 5.

The structure of the magnetoresistive sensor device according to the present Example was similar to that in Examples 3 and 4 except for the resin film. The sensor elements were GMR sensor elements and were arranged in the sensor element regions 12a and 12b. A plane view of a magnetoresistive sensor device according to the present Example corresponds to FIG. 5. The sensor element region 12a was formed above the capacitor C1 in the IC and had a relatively flat surface on the capacitor. In contrast, the sensor element region 12b was formed above the IC where the wiring was intricate and therefore the level differences of the wiring made an uneven surface. The resin film was disposed between the sensing portion and the IC had a two-layer structure comprising the resin films 6a and 6b, the same as that in Example 4. The resin film 6a used a film in which silicone polymer (B) as used in Example 3 was subjected to a heat curing process after application. Further, the resin film 6b was formed on the resin film 6a and it used a film in which silicone polymer (D) was subjected to a heat curing process after application. This silicone polymer (D) had the structure represented by Formula (2) having an average molecular weight of 2,500, wherein among R1 and R2 in the side chain, 90% are phenyl groups and 10% are butyl groups, and every R3, R4, R5 and R6 are hydrogen atoms. Since the resin film 6a was a polymer having an average molecular weight of greater than 100,000, it had a lower function for filling in the level differences. In contrast, the resin film 6b was a polymer having an average molecular weight of less than 50,000 and had a melt flow (reflow) property before curing. Thereby the resin film 6b had a higher function for filling in the level differences. FIG. 8 is a sectional view taken along line A–A' of FIG. 5 of a magnetoresistive sensor device according to the present Example. The protective film 9 is omitted in FIG. 8.

The magnetoresistive sensor device according to the present Example was produced by a process similar to that in Example 4. The resin film 6a was formed in a thickness of 0.3 micrometers by using silicone polymer (B). The resin film 6b was formed on the resin film 6a at a thickness of 2.0 micrometers by using silicone polymer (D). The thickness of the resin film 6b was reduced by process completion, thereby resulting in the resin film 6b having a thickness of about 1.7 micrometers. The heat treatment of the resin film 6b, the re-flowing and post-baking thereof may be carried out similar to Example 4. The GMR sensor element film formed in the present Example was similar to that in Examples 3 and 4.

The underlying face of the sensing portion in the present Example differs from that in Example 4 in the thickness with which the resin film 6b was applied, while the resin films were a two-layer structure the same as in Example 4. The sensor element region 12a was formed above the capacitor C1 in the IC and had satisfactory flat characteristics on the surface of both the resin films 6a and 6b. In contrast, the sensor element region 12b was formed above the IC where the wiring was intricate and the level differences of the wiring made an uneven surface on resin film 6a, while the resin film 6b perfectly filled in the unevenness on the resin film 6a to make a flat surface of the resin film 6b. As the silicone polymer (B) of the resin film 6a was a polymer having an average molecular weight of greater than 100,000, it thereby had a lower function for filling in the level differences. In contrast, as the silicone polymer (D) of the resin film 6b was a polymer having an average molecular weight of less than 50,000, it thereby had a higher function for filling in the level differences. As the silicone polymer (D) differs from that in Example 4 in that it had an organic component ratio of greater than 0.4, it did not form cracks in the film even if it is made into a relatively thick film, which allows the resin film 6b to have thickness sufficient to fill in the deepest level differences in the IC, to obtain an underlying face with greater flatness. For the reasons set forth above, the GMR sensor elements had no disconnection of pattern so there were had no substantial differences in the resistance between the sensor element regions 12a and 12b when applying a magnetic field greater than the saturation magnetic field of the GMR sensor elements or when there was no magnetic field, providing a good balance between the potentials of the medial point potential terminals 19 and 20 in the Wheatstone bridge circuit. In addition to the above, the characteristics of the underlying face were better with less variations in the characteristics. In comparison with Example 4, no substantial differences were found with regard to the characteristics. However, in contrast to Example 4 where the underlying face of the sensing portion had an exposed face of the resin film 6a, in the present Example the resin film 6b completely covered the resin film 6a resulting in a higher flatness over the Example 4. Further, no degradation was observed after the endurance tests. The present Example where an identical condition of the underlying layer can be achieved at any place on the IC is ideal with regard to the positional flexibility of the sensing portion.

Further, another form conceivable from the two layer structure of the resin films of the present Example can realize sensor characteristics similar to that of the present Example. The other form, in other words, a film structure wherein the cured film of silicone polymer (D) is applied to the resin film 6a and the cured film of silicone polymer (B)

is applied to the resin film 6b in the two layer structure of the resin films of the present Example provides a good underlying face similar to the present Example, with similar good results in both sensor characteristics and variations thereof.

Example 6

Figure 9:
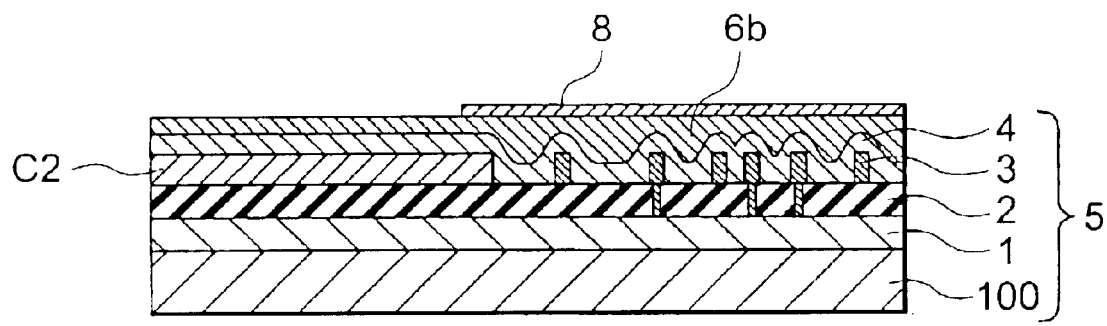
FIG. 9 is a sectional view of a magnetoresistive sensor device in Example 6 taken along line A–A' of FIG. 5.

The structure of the magnetoresistive sensor device according to the present Example was similar to that in Example 5 except for the resin film 6a. The sensor elements were the GMR sensor elements and were arranged in the sensor element regions 12a and 12b. A plane view of a magnetoresistive sensor device according to the present Example corresponds to FIG. 5. The sensor element region 12a was formed above the capacitor C1 in the IC and had a relatively flat surface on the capacitor. In contrast, the sensor element region 12b was formed above the IC where the wiring was intricate and therefore the level differences of the wiring made an uneven surface. The resin film was disposed between the sensing portion and the IC was only the resin film 6b. The resin film 6b used a film in which silicone polymer (D) as used in Example 5 was subjected to a heat curing process after application. Further, the resin film 6b was a polymer having an average molecular weight of less than 50,000 and had a melt flow (reflow) property before curing. Thereby the resin film 6b had a higher function for filling in the level differences. FIG. 9 is a sectional view taken along line A–A' of FIG. 5 of a magnetoresistive sensor device according to the present Example. The protective film 9 is omitted in FIG. 9.

The magnetoresistive sensor device according to the present Example was produced by a process similar to that in Example 5. However, in the absence of resin film 6a, the process for the resin film 6b production was somewhat altered in compliance with the structural change of the resin film portion. Thus, the formation of a contact hole and the opening of a pad were performed for the shorter period of time required for etching the resin film 6a. The resin film 6b was formed in a thickness of 2.0 micrometers by using silicone polymer (D). The thickness of the resin film 6b was reduced by process completion, thereby resulting in the resin film 6b having a thickness of about 1.7 micrometers. The heat treatment of the resin film 6b, the re-flowing and post-baking thereof may be carried out similar to that in Example 4. The GMR sensor element film formed in the present Example was similar to that in Examples 3 and 4.

The underlying face of the sensing portion in the present Example was similar to that in Example 5. The sensor element region 12a was formed above the capacitor C1 in the IC and had satisfactory flatness on the resin film 6b. In contrast, the sensor element region 12b was formed above the IC where the wiring was intricate and therefore the level differences of the wiring made an uneven surface, but the resin film 6b filled in the unevenness to make a flat surface on the resin film 6b. As the silicone polymer (D) of the resin film 6b was a polymer having an average molecular weight of less than 50,000, it thereby had a higher function for filling in the level differences. As it had an organic component ratio of greater than 0.4, it did not form cracks in the film if made into a relatively thick film, which allows the resin film 6b to have thickness sufficient to fill in the deepest level differences in the IC and an underlying face with greater flatness was obtained. The underlying face of the resin film 6b did not alleviate the level differences and did not make the rectangular portions of the level differences due to the absence of the resin film 6a. Nevertheless, the generation of cracks in the film did not occur as the film had a relatively higher resistance to cracking. For the reasons set forth above, the GMR sensor elements had no disconnection of pattern so there were had no substantial differences in the resistance between the sensor element regions 12a and 12b when applying a magnetic field greater than the saturation magnetic field of the GMR sensor elements or when there was no magnetic field, providing a good balance between the potentials of the medial point potential terminals 19 and 20 in the Wheatstone bridge circuit. In addition to the above, the characteristics of the underlying face were better with less variations in the characteristics. In Comparison with Examples 4 and 5, no substantial differences were found with regard to the characteristics. The underlying face of the sensing portion in the present Example obtained a greater flatness the same as in Example 5 since the resin film 6b completely covered the IC protective film 4. Further, no degradation was observed after the endurance tests. The present Example where an identical condition of the underlying layer can be achieved at any place on the IC is ideal with regard to the positional flexibility of the sensing portion as in Example 5. Additionally, the present Example has the advantage of using a single resin film structure so that the production process is simple relative to a plural resin film structure.

In addition to the present Examples, a flat surface could be obtained in Examples 4 and 5 by using a cured film of silicone polymer having an average molecular weight of less than 10,000. The re-flow characteristics of the resin film in accordance with the present Example could be obtained by using a cured film of silicone polymer having an average molecular weight of less than 50,000. If a film having particularly higher re-flow characteristics is desirable, then the use of the polymer having an average molecular weight of less than 10,000 is preferred.

In the resin film structures in the above Examples, the margin for the thickness of the resin film was determined depending upon both the depth of level differences above the IC at a position where the sensing portion was arranged and the resistance to cracking. Since the cured film of the polymer having an average molecular weight of greater than 100,000 has a greater propensity to cover the level differences, it is acceptable to provide it with a thickness greater than a residual thickness after the reduction of the film thickness by the process. Since it also has high crack resistance, a thickness of less than 5 micrometers is practicable. On the other hand, since the cured film of the polymer having an average molecular weight of less than 50,000 has high re-flow properties prior to curing, it is desirable to provide it with a thickness greater than the depth of the level differences. However, if the rectangular portions of the level differences are already in a smooth state as in Examples 4 and 5, it may be permissible to thinly fill in the unevenness in level differences. The crack resistance is influenced by the organic component ratio in the resin film. A resin film having an organic component ratio of greater than 0.4 has a relatively high crack resistance and thus a film thickness of less than 3 micrometers may be practicable. In contrast to the former, a resin film having an organic component ratio of less than 0.4 has a low crack resistance and thus a film thickness of less than 1.5 micrometers can achieve the purpose of the present invention.

Comparative Example 1

A Comparative Example is hereinafter described for comparison with the Examples of the present invention.

Figure 10:
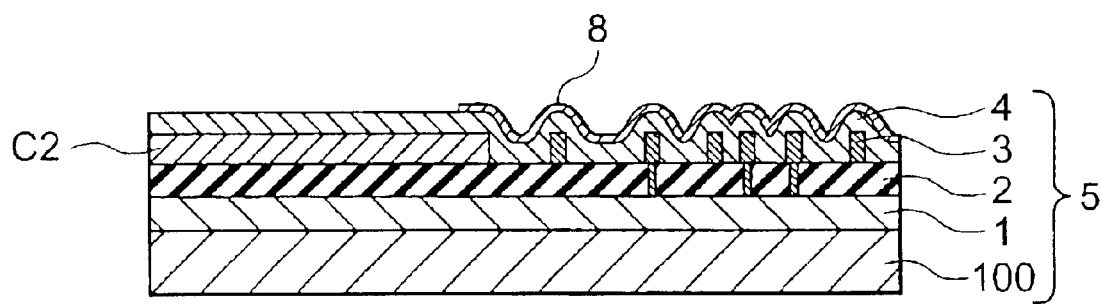
FIG. 10 is a sectional view of a magnetoresistive sensor device in Comparative Example 1 taken along line A–A' of FIG. 5.

A magnetoresistive sensor device according to this Comparative Example had a structure similar to the structures in Examples 3, 4, 5 and 6 except for the absence of the resin film. Thus, the sensor elements were GMR sensor elements and arranged in the sensor element regions 12a and 12b. A plane view of the magnetoresistive sensor device according to this Comparative Example corresponds to FIG. 5. The sensor element region 12a was formed above the capacitor C1 in the IC and had a relatively flat surface on the capacitor. In contrast, the sensor element region 12b was formed above the IC where the wiring was intricate and therefore the level differences of the wiring made an uneven surface. There was no intervening resin film between the sensing portion and the IC. Thus, the sensing portion was directly formed on the protective film 4 of the IC. FIG. 10 is a sectional view taken along line A–A' of FIG. 5 of a magnetoresistive sensor device according to this Comparative Example. The protective film 9 is omitted in FIG. 10.

The magnetoresistive sensor device according to the present Example was produced by a process similar to that in Example 6. However, in the absence of resin films, the process for the resin film production was somewhat altered in compliance with the structural change of the resin film portion. Thus, the formation of a contact hole and the opening of a pad were performed for the shorter period of time required for etching the resin film 6b.

The underlying face of the sensing portion of this Comparative Example corresponded to the IC protective film 4, which means it differs from the state of the underlying face of the sensing portion of the Examples of the present invention. The sensor element region 12a was formed above the capacitor C1 in the IC and the flatness on the protective film 4 was acceptable. The sensor element region 12b was formed above the IC where the wiring was intricate and there were level differences of the wiring, thus causing an uneven surface on the protective film 4. As the protective film 4 consisted of an inorganic film, it had a poor effect in alleviating the level differences and also in making the rectangular portions of the level differences into a smooth shape. For there reasons, the patterns of the GMR sensor elements were discontinued or even if they were not disconnected, there were differences in resistance between the sensor element regions 12a and 12b when applying a magnetic field greater than the saturation magnetic field of the GMR sensor elements or when there was no magnetic field, creating a bad-balance between the potentials of the medial point potential terminals 19 and 20 in the Wheatstone bridge circuit. In addition, the characteristics of the sensor were worse with variations in the characteristics, thereby affecting both an increase of resistance in the GMR sensor element pattern and a decrease of the resistance changes rate. Further, fresh disconnections of the wiring and an increase in resistance value occurred after the endurance tests.

Figure 11:
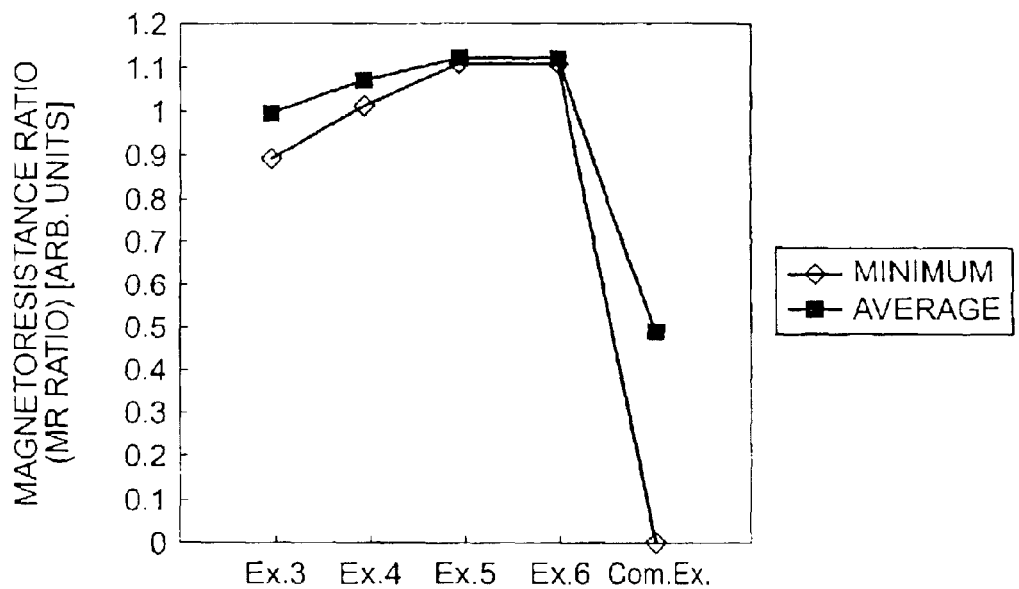
FIG. 11 is a graph showing the characteristics of a magnetoresistance ratio (MR ratio) of the magnetoresistive sensor device in Examples 3, 4, 5 and 6, and Comparative Example 1.
Figure 12:
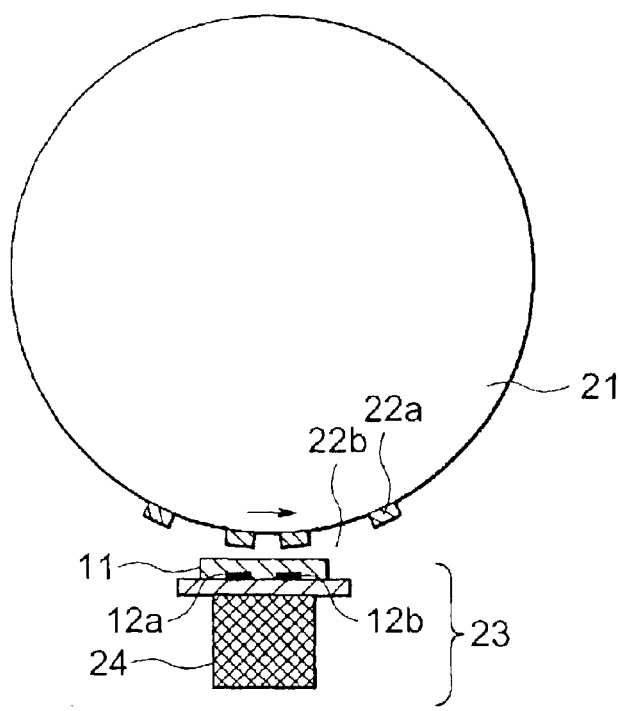
FIG. 12 is a diagram for describing an example of the structure of a conventional rotary sensor.
Figure 13:
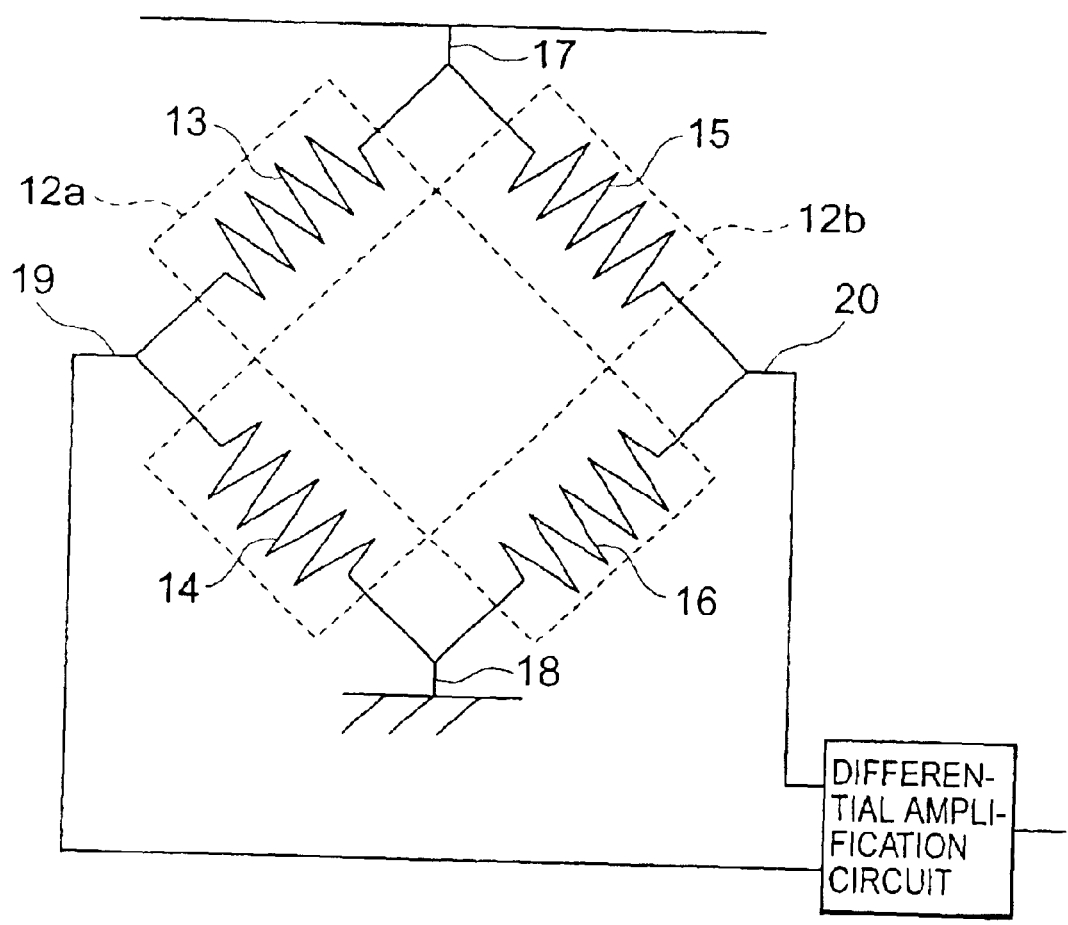
FIG. 13 is a structural diagram of a Wheatstone bridge circuit using the rotary sensor.
Figure 14A:
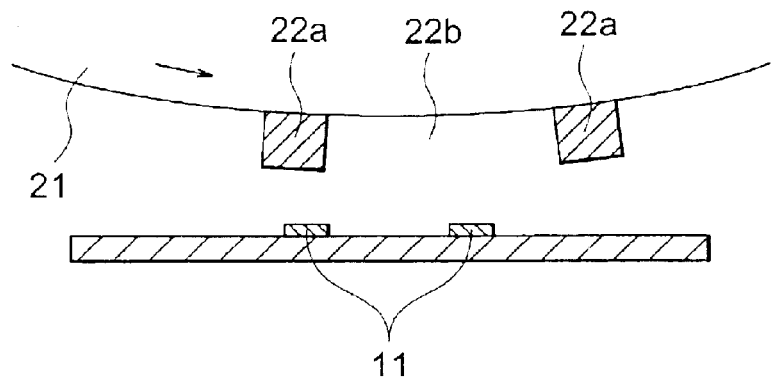
FIG. 14 is a diagram for describing the relationship between the position of the sensing portion and rotating object and the generating magnetic field.
Figure 14B:
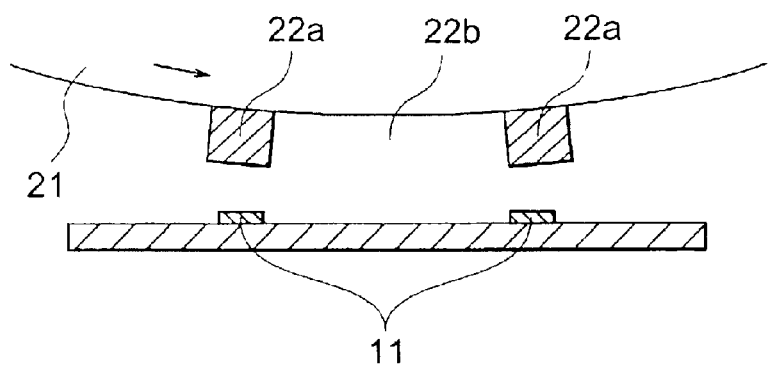
Figure 14C:
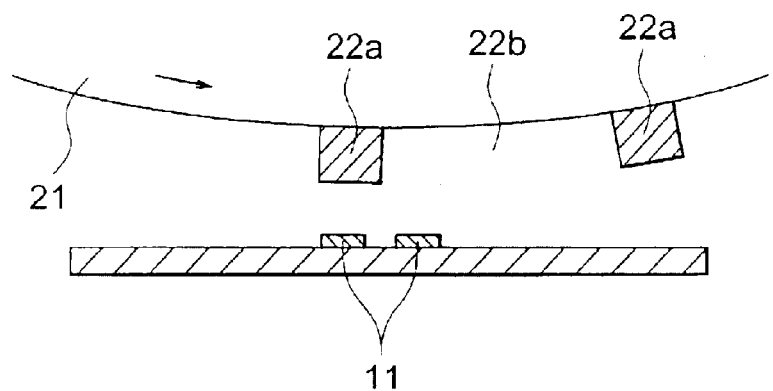
Figure 15:
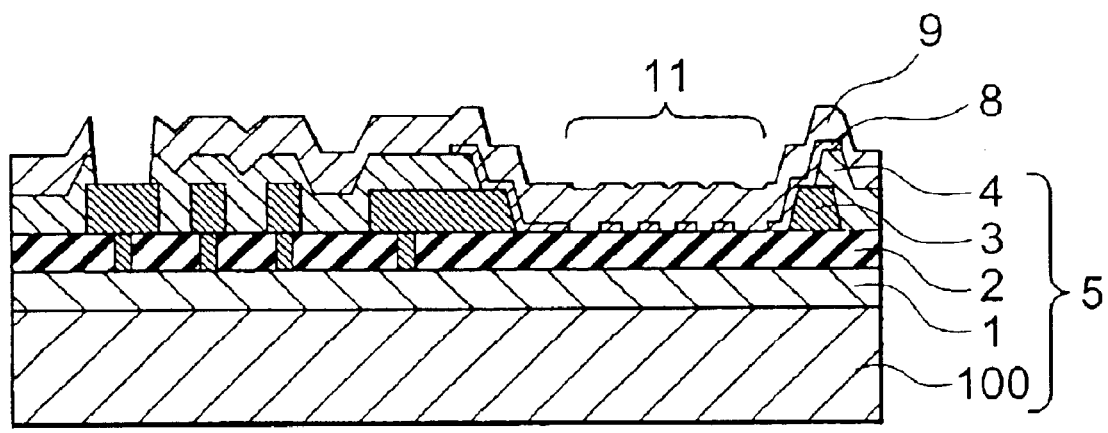
FIG. 15 is a sectional view showing an example of a magnetoresistive sensor device of a conventional monolithic structure.

FIG. 11 is a graph showing the characteristics of the magnetoresistive sensor device of Examples 3, 4, 5 and 6 compared to those of Comparative Example 1. The magnetoresistance ratio (MR ratio) of the GMR sensor elements is shown based on the characteristics of Example 3 with the variations (minimum).

In the position of the sensing portion shown in FIG. 5, as the level differences on the IC differ greatly between the sensor element regions 12a and 12b, the size of the variations of the % MR indicates whether the sensing element region can be disposed any where on the IC. All the Examples showed to favorable values in % MR and thus significant differences were found relative to the Comparative Examples. All Examples also showed less variations in % MR respectively and significant differences were found relative to the Comparative Examples. In addition, if the resin film is composed of a cured film of a polymer having an average molecular weight of less than 50,000, or if the resin film is composed of a plurality of film layers wherein at least one resin film is a cured film of a polymer having an average molecular weight of less than 50,000, then the variation in % MR is very narrow, so that the positional flexibility in the positioning of the sensing portion is higher.

An endurance test was carried out on each Example mentioned above and the test was for vehicle-mounted devices which is deemed to be the most severe conditions. In particular, the GMR sensor elements produced in each of Examples 3 to 6, had excellent characteristics over conventional high heat resistant GMR sensor elements (D. Wang, J. Anderson, J. M. Daughton, IEEE TRANSACTIONS ON MAGNET ICS VOL. 33, NO. 5, pp 3520–3522, 1997) as a vehicle-mounted sensor element in practical use. There characteristics were not damaged with regard to the resin film structure in any Example. In addition to a high positional flexibility in the positioning on the IC, the GMR sensor element also had high reliability.

What is claimed is:

1. A magnetoresistive sensor device comprising a substrate, and a sensing portion and a signal processing circuit formed above said substrate with a resin film being disposed between said sensing portion and said signal processing circuit, wherein said sensing portion detects changes in a magnetic field induced by a moving body and further said sensing portion being located at a position for effectively detecting changes in a magnetic field induced by said moving body, said sensing portion comprising a magnetoresistive sensor element, wherein said sensing portion is constituted by a giant magnetoresistive sensor element, and wherein:

1) said giant magnetoresistive sensor element comprises magnetic layers mainly containing Ni, Fe and Co alternately laminated with nonmagnetic layers mainly containing Cu, wherein said magnetic layers satisfy an atomic compositional ratio represented by the following formula:

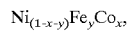

$Ni_{(1-x-y)}Fe_yCo_x$, where $x \geq 0.7$, $y \leq 0.3$, and $(1-x-y) \leq 0.15$, and said nonmagnetic layers satisfy an atomic compositional ratio represented by the following formula:

$Cu_zA_{(1-z)}$, where A is any additive element other than Cu, and $z \geq 0.9$, wherein the thickness of said magnetic layers(tm) and said nonmagnetic layers(tn) satisfies the following conditions respectively:

10 Å<tm<25 Å and 18 Å<tn<25 Å, 2) said giant magnetoresistive sensor element has a periodically repeating structure comprising a laminated body of said magnetic layers laminated with said nonmagnetic layers as one unit thereof, wherein the repeating number(N) of said periodically repeating structure satisfies the following conditions:

$10 \leq N \leq 40$, 3) said giant magnetoresistive sensor element comprises a buffer layer disposed between said resin film and said magnetic layers or disposed between said resin film and said nonmagnetic layers, wherein the thickness of said buffer layer(tb) satisfies the following conditions:

10 Å<tb<80 Å.

2. A magnetoresistive sensor device according to claim 1, wherein said magnetoresistive sensor device is mounted on a vehicle.

3. A magnetoresistive sensor device comprising a substrate, and a sensing portion and a signal processing circuit formed above said substrate with a resin film being disposed between said sensing portion and said signal processing circuit, wherein said sensing portion detects changes in a magnetic field induced by a moving body and further said sensing portion being located at a position for effectively detecting changes in a magnetic field induced by said moving body, said sensing portion comprising a magnetoresistive sensor element, and wherein said resin film is a cured film of silicone polymer having an average molecular weight of equal to or greater than 1000 and composed only of 1 to 4 units of the following Structural Units Group (1):

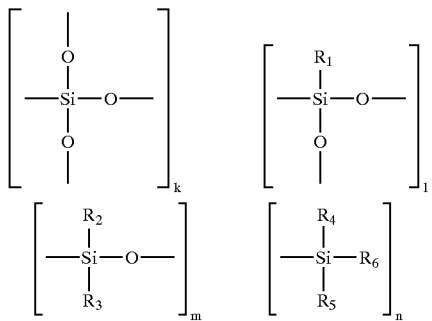

wherein $R_1$, $R_2$, $R_3$, $R_4$, $R_5$ and $R_6$ are a hydrogen atom, a hydroxyl, an aryl, an aliphatic alkyl, and a trialkylsilyl groups, or a functional group having an unsaturated bond, and k, l, m and n are an integer greater than or equal to 0, but all of them are not all 0.

4. A magnetoresistive sensor device according to claim 3, wherein said resin film is a cured film of silicone polymer represented by the following Formula (2):

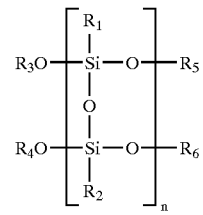

wherein $R_{1'}$ and $R_{2'}$ are a hydrogen atom, an aryl, an aliphatic alkyl groups, or a functional group having an unsaturated bond, and $R_{3'}$, $R_{4'}$, $R_{5'}$ and $R_{6'}$ are a hydrogen atom, an aryl, an aliphatic alkyl, a trialkylsilyl groups, or a functional group having an unsaturated bond and n is a natural number.

5. A magnetoresistive sensor device according to claim 3, wherein said resin film has an average molecular weight of equal to or greater than 100,000.

6. A magnetoresistive sensor device according to claim 3, wherein said resin film has an average molecular weight of equal to or less than 50,000.

7. A magnetoresistive sensor device according to claim 6, wherein said resin film satisfies an organic component ratio of equal to or greater than 0.4.

8. A magnetoresistive sensor device comprising a substrate, and a sensing portion and a signal processing circuit formed above said substrate with a resin film being disposed between said sensing portion and said signal processing circuit, wherein said sensing portion detects changes in a magnetic field induced by a moving body and further said sensing portion being located at a position for effectively detecting changes in a magnetic field induced by said moving body, said sensing portion comprising a magnetoresistive sensor element, and wherein said resin film is composed of a laminated film comprising a plurality of film layers, each of said film layers being composed of a cured film of a different curing polymer.

9. A magnetoresistive sensor device according to claim 8, wherein said laminated film comprises at least one cured film of a silicone polymer represented by said Formula (2) having an average molecular weight of equal to or greater than 1,000 up to 50,000 and an organic component ratio of equal to or greater than 0.4.

10. A magnetoresistive sensor device according to claim 8, wherein said laminated film comprises at least one cured film of a silicone polymer represented by said the Formula (2) having an average molecular weight of equal to or greater than 1,000 up to 50,000 and an organic component ratio of equal to or less than 0.4.

* * * * *